United States Patent
Kao et al.

(10) Patent No.: US 9,741,537 B1
(45) Date of Patent: Aug. 22, 2017

(54) METHOD AND APPARATUS FOR SUPPLYING ION BEAM IN ION IMPLANTATION PROCESS

(71) Applicant: Taiwan Semiconductor Manufacturing Co., Ltd., Hsinchu (TW)

(72) Inventors: Tai-Kun Kao, Hsinchu (TW); Tsung-Min Lin, Zhubei (TW); Jen-Chung Chiu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/342,582

(22) Filed: Nov. 3, 2016

Related U.S. Application Data

(60) Provisional application No. 62/297,167, filed on Feb. 19, 2016.

(51) Int. Cl.
| H01J 37/08 | (2006.01) |
| H01J 37/30 | (2006.01) |
| H01J 37/317 | (2006.01) |
| H01L 21/265 | (2006.01) |

(52) U.S. Cl.
CPC .......... *H01J 37/3171* (2013.01); *H01J 37/08* (2013.01); *H01L 21/26513* (2013.01)

(58) Field of Classification Search
CPC .......... H01J 37/08; H01J 37/147; H01J 37/30; H01J 37/3007; H01J 37/301; H01J 37/302; H01J 37/317; H01J 37/3171; H01J 37/3172; H01J 37/3174
USPC ..................................... 250/423 R, 424, 426
See application file for complete search history.

(56) References Cited

U.S. PATENT DOCUMENTS

| 7,674,394 | B2 * | 3/2010 | Paterson ............... C23C 16/505 |
| | | | 156/345.29 |
| 7,973,293 | B2 | 7/2011 | Lin et al. |
| 8,464,186 | B2 | 6/2013 | Wang et al. |
| 8,468,473 | B1 | 6/2013 | Wang et al. |
| 8,473,877 | B2 | 6/2013 | Wang et al. |
| 8,507,159 | B2 | 8/2013 | Wang et al. |
| 8,510,687 | B1 | 8/2013 | Liu et al. |
| 8,524,427 | B2 | 9/2013 | Shin et al. |
| 8,530,121 | B2 | 9/2013 | Wang et al. |
| 8,563,224 | B1 | 10/2013 | Chen et al. |
| 8,584,057 | B2 | 11/2013 | Liu et al. |
| 8,601,407 | B2 | 12/2013 | Wang et al. |
| 8,609,308 | B1 | 12/2013 | Chen et al. |
| 8,627,241 | B2 | 1/2014 | Wang et al. |
| 8,677,511 | B2 | 3/2014 | Wang et al. |
| 8,762,900 | B2 | 6/2014 | Shin et al. |
| 8,822,106 | B2 | 9/2014 | Wang et al. |

(Continued)

*Primary Examiner* — Nicole Ippolito
(74) *Attorney, Agent, or Firm* — McClure, Qualey & Rodack, LLP

(57) ABSTRACT

A method for generating an ion beam in an ion implantation process is provided. The method includes supplying a working gas into a first portion of an arc chamber which is separated from a second portion of the arc chamber by an intermediate plate. The method further includes guiding the working gas into the second portion of the arc chamber via a plurality of gas outlets formed at two opposite edges of the intermediate plate. The method also includes generating an ion beam from the working gas in the second portion of the arc chamber.

20 Claims, 10 Drawing Sheets

(56) References Cited

U.S. PATENT DOCUMENTS

| | | |
|---|---|---|
| 8,828,632 B2 | 9/2014 | Wang et al. |
| 8,835,082 B2 | 9/2014 | Chen et al. |
| 8,841,049 B2 | 9/2014 | Wang et al. |
| 8,846,278 B2 | 9/2014 | Shin et al. |
| 2003/0234372 A1* | 12/2003 | Park ................ H01J 37/08 250/492.21 |
| 2011/0048325 A1* | 3/2011 | Choi ................ C23C 16/452 118/712 |
| 2011/0049100 A1* | 3/2011 | Han ................ H01J 37/32623 216/67 |
| 2014/0227453 A1 | 8/2014 | Wang et al. |
| 2015/0348720 A1* | 12/2015 | Smeltzer ................ H01H 9/34 218/151 |

* cited by examiner

METHOD AND APPARATUS FOR SUPPLYING ION BEAM IN ION IMPLANTATION PROCESS

PRIORITY CLAIM AND CROSS-REFERENCE

This application claims the benefit of U.S. Provisional Application No. 62/297,167, filed on Feb. 19, 2016, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

In an ion implanter, an ion generator may generate an ion beam and direct the ion beam towards the target wafer. Ion implantation is a process in semiconductor manufacturing for doping different atoms or molecules into a wafer. By employing ion implantation, the majority charge carriers of the implanted portions of the wafer may be altered so as to produce different types and levels of conductivity in regions of a wafer. Ion implanters are automated tools which are used to perform the ion implantation. In an ion implanter, an ion generator may generate an ion beam and direct the ion beam towards the target wafer. The target wafer should be handled properly onto the wafer holder for the implanter to properly implant the target wafer.

Although existing devices and methods for implanting ion implantation process have been generally adequate for their intended purposes, they have not been entirely satisfactory in all respects. Consequently, it would be desirable to provide a solution for ion implantation for use in a wafer process apparatus.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
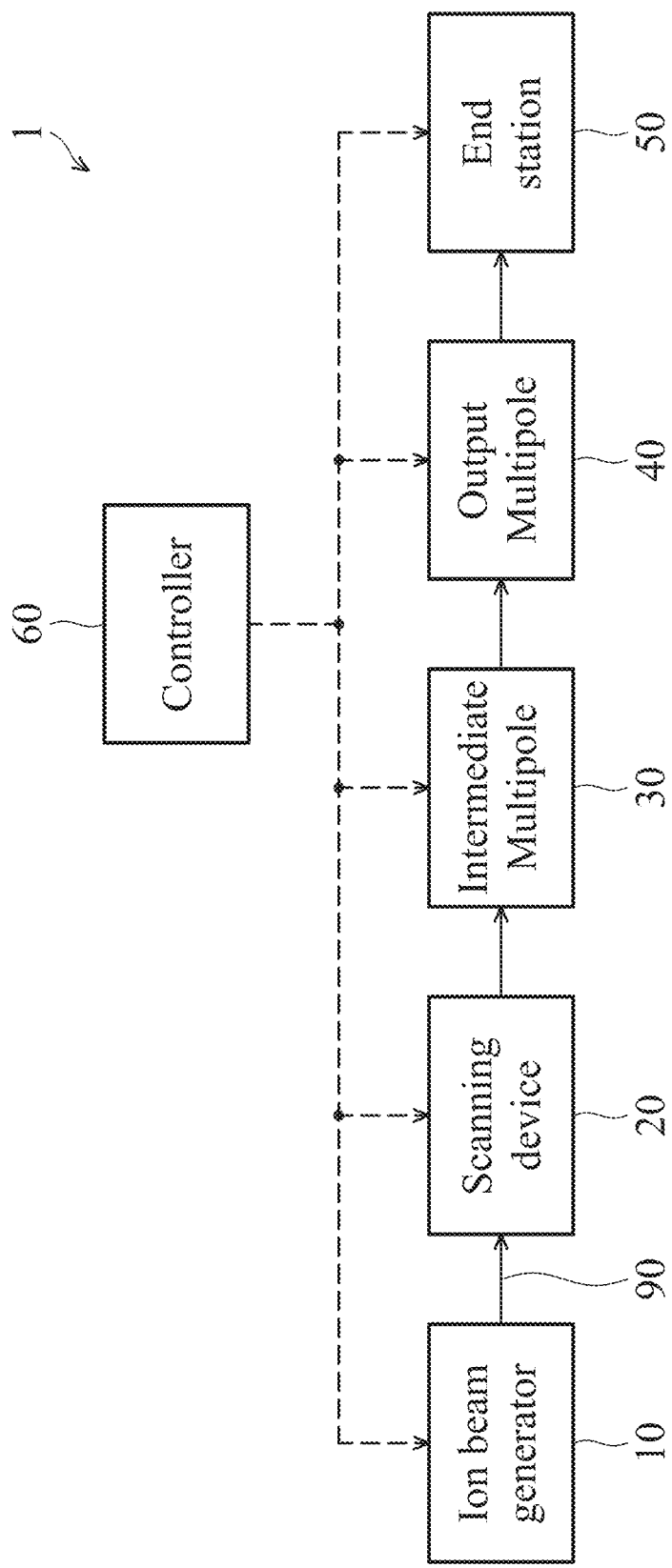
FIG. 1 shows a schematic block diagram of a processing apparatus in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIG. 1 is a schematic block diagram of a processing apparatus 1 in accordance with some embodiments. In some embodiments, the processing apparatus 1 is configured to perform ion implantation on a work piece, such as a semiconductor wafer. Additionally, the processing apparatus 1 may be configured to perform other processing using ion beams, such as film deposition or surface treatment. Furthermore, the processing apparatus 1 is configured to process not only wafers for semiconductor devices, but also other types of substrates, such as solar panels.

The processing apparatus 1 includes an ion beam generator 10, a scanning device 20, an intermediate multi-pole device 30, an output multi-pole device 40, an end station 50, and a controller 60. The scanning device 20, the intermediate multi-pole device 30, and the output multi-pole device 40 are arranged along a path 70 between the ion beam generator 10 and the end station 50.

The ion beam generator 10 is configured to generate an ion beam. The ion beam generator 10 transmits the ion beam toward the end station 50. An ion beam generator 10 in accordance with some embodiments will be described with respect to FIGS. 2-6.

The scanning device 20 is located downstream of the ion beam generator 10 on the path 90. The scanning device 20 is configured to scan the ion beam having the first configuration in a scanning direction that is transverse to the path 90. In one or more embodiments, the scanning device 20 includes a pair of coils for generating an electromagnetic field between the coils that varies in time in accordance with the frequency of the power supplied to the coils. As the ion beam passes between the pair of coils, the time-varying electromagnetic field deflects the ions in the ion beam according to the left-hand rule or the right-hand rule. As a result, the whole ion beam is reciprocally deflected, i.e., scanned, in the scanning direction between the pair of coils.

The intermediate multi-pole device 30 is located downstream of the scanning device 20 on the path 90. The intermediate multi-pole device 30 is configured to control the parallelism of the ion beam. In other words, the intermediate multi-pole device 30 is configured to adjust the trajectory of ions in the ion beam to be parallel, or as close as possible to being parallel, with the path 90 along which the ion beam is being transmitted. As a result, the ion beam output from the intermediate multi-pole device 30 includes ions that travel in parallel or substantially parallel trajectories. In one or more embodiments, the intermediate multi-pole device 30 is omitted from the processing apparatus 1.

The output multi-pole device 40 is configured to control the uniformity of the ion beam. In other words, the output multi-pole device 40 is configured to adjust the beam current and/or beam energy so that it is uniform, or as close as possible to being uniform, across the beam profile. As a result, the ion beam output from the output multi-pole device 40 is uniform, or substantially uniform, across the beam profile, thereby permitting a uniform dose of ions to be applied to a work piece. In one or more embodiments, the output multi-pole device 40 is omitted from the processing apparatus 1.

The end station 50 is located at the end of the path 90. The end station 50 is configured to support a work piece thereon. In one or more embodiments, the work piece is a semiconductor wafer. The end station 50 includes a chuck for holding the work piece thereon, and an actuator for moving the chuck, with the work piece held thereon, in one or more directions. The movement of the chuck is configured so that the ion beam impinges in a uniform manner on the work piece. In some embodiments, the end station 50 further includes a load lock for transferring wafers into and out of the processing apparatus 1, and a robot arm for transferring wafers between the chuck and the load lock. In some embodiments, the end station 50 further includes a measuring device for measuring one or more properties of the ion beam to be impinging on the work piece, thereby providing feedback information for adjusting the ion beam in accordance with a processing recipe to be applied to the work piece. Examples of measured ion beam properties include, but are not limited to, beam profile, beam energy and beam current.

The controller 60 is coupled to the various components of the processing apparatus 1 for controlling operation of the various components. For example, the controller 60 controls the ion beam generator 10 to vary one or more ion beam properties, including, but not limited to, beam current, beam energy and beam profile. The controller 60 further controls parameters, e.g., the scanning frequency, of the scanning operation of the scanning device 20. The controller 60 also controls one or more of the parallelism tuning operation of the intermediate multi-pole device 30 and the uniformity tuning operation of the output multi-pole device 40. The controller 60 is coupled to the end station 50 to control one or more of work piece transfer and chuck movement. In one or more embodiments, the controller 60 is coupled to the measuring device provided in the end station 50 to receive the feedback information for adjusting operation of one or more of the other components of the processing apparatus 1. In some embodiments, the controller 60 is one or more computers or microprocessors programmed to perform one or more functions described herein. In some embodiments, the controller 60 is one or more microprocessors hard-wired to perform one or more functions described herein.

Figure 2:
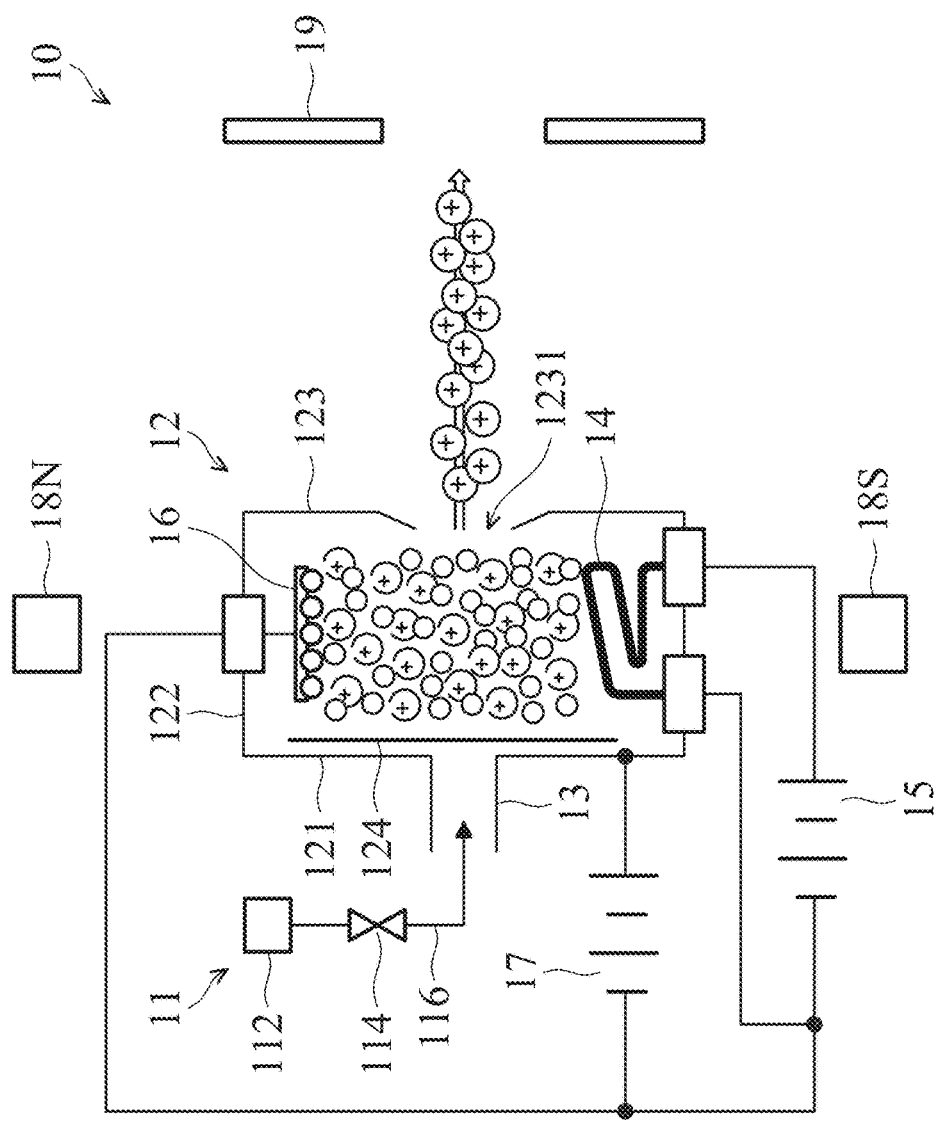
FIG. 2 shows a schematic view of an ion beam generator, in accordance with some embodiments.

FIG. 2 is a schematic view of an ion beam generator 10, in accordance with some embodiments. In some embodiments, the ion beam generator 10 includes a gas source 11, an arc chamber 12, an inlet port 13, a filament 14, a filament power supply 15, an electrode 16, an arc power supply 17, a set of magnets 18N and 18S, and an extraction electrode 19.

The gas source 11 is configured to store and supply working gas to be ionized into the arc chamber 12. In some embodiments, the gas source 11 includes a container 112, a valve 114, and a tube 116. The container 112 may contain a mixture of dopant gas and dilutant gas (e.g., xenon and hydrogen). The dopant gas may comprise Ge, As, B, $BF_3$, $PH_3$, $AsH_3$, or other species to be implanted in semiconductor substrates. The dilutant gas may comprise xenon and hydrogen.

The tube 116 connects the gas source 11 to the arc chamber 12. The valve 114 connects to the tube 116 to control the flow of the working gas in the tube 116 according to control signal from the controller 60 (FIG. 1).

In some embodiments, the arc chamber 12 includes a lower wall 121, a side wall 122, a top wall 123, and an intermediate plate 124. The lower wall 121, the side wall 122, and the top wall 123 define an interior in the arc chamber 12.

In some embodiments, the filament 14 and the electrode 16 are positioned at two opposite sides of the side wall 122. The filament power supply 15 provides power to heat the filament 14, causing acceleration of electrons toward the filament 14. The arc power supply 15 supplies the power to the electrode 16 to accelerate electrons emitted by the filament 14 into a plasma. The set of magnets 18N and 18S is provided to establish a magnetic field for the ion beam formation. The top wall 123 has an aperture 1231, through which the ion beam passes. The extraction electrode 19 shapes and defines the ion beam as it leaves the ion beam generator 10.

Figure 3:
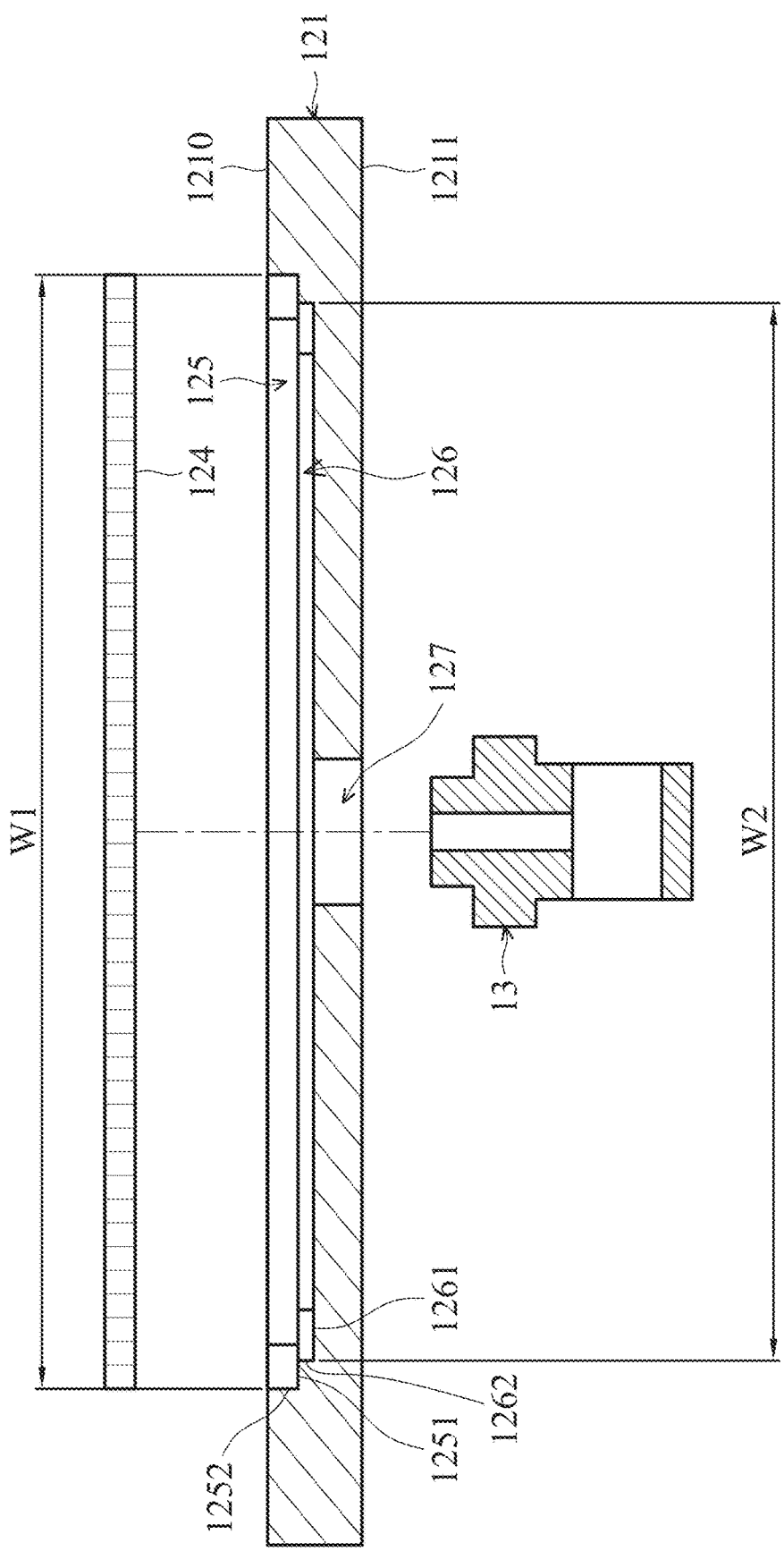
FIG. 3 shows a schematic cross-sectional view of partial elements of an arc chamber and an inlet port, in accordance with some embodiments.

FIG. 3 shows a schematic cross-sectional view of partial elements of the arc chamber 12 and the inlet port 13, in accordance with some embodiments. In some embodiments, a first recess 125 is formed on the top surface 1210 of the lower wall 121. A second recess 126 is formed at the bottom surface 1251 of the first recess 125. The width W1 of the first recess 125 is greater than the width W2 of the second recess 126, and a bottom surface 1251 of the first recess 125 vertically connects the side surface 1252 to the side wall 1262.

Additionally, a through hole 127 is formed at the substantial center of the bottom surface 1261 of the second recess 126. The through hole 127 connects the second recess 126 to the bottom surface 1211 and extends along a direction that is parallel to the thickness direction of the lower wall 121.

Figure 4:
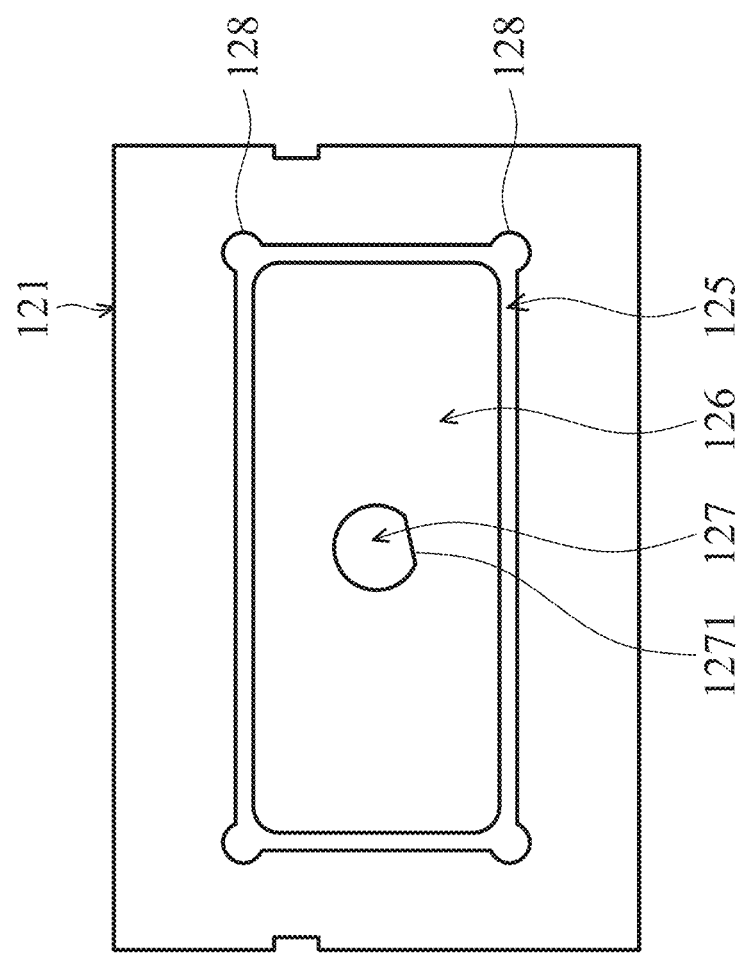
FIG. 4 shows a top view of a lower wall of an arc chamber, in accordance with some embodiments.

FIG. 4 shows a top view of the lower wall 121, in accordance with some embodiments. In some embodiments, the cross section of the through hole 127 is not a round shape, and a straight cutting edge 1271 is formed therein for increasing the ease and efficiency of positioning the inlet port 13. In some embodiments, four notches 128 are formed at four corners of the first recess 125 for facilitating the fabrication of the lower wall 121.

Referring again to FIG. 3, the intermediate plate 124 is positioned in the first recess 125. The intermediate plate 124 may have a shape that is compatible with that of the first recess 125. The thickness of the intermediate plate 124 may be made equal to the depth of the first recess 125, so that when the intermediate plate 124 is positioned in the first recess 125, the top surface of the intermediate plate 124 is as high as the top surface 1210 the lower wall 121.

Figure 5:
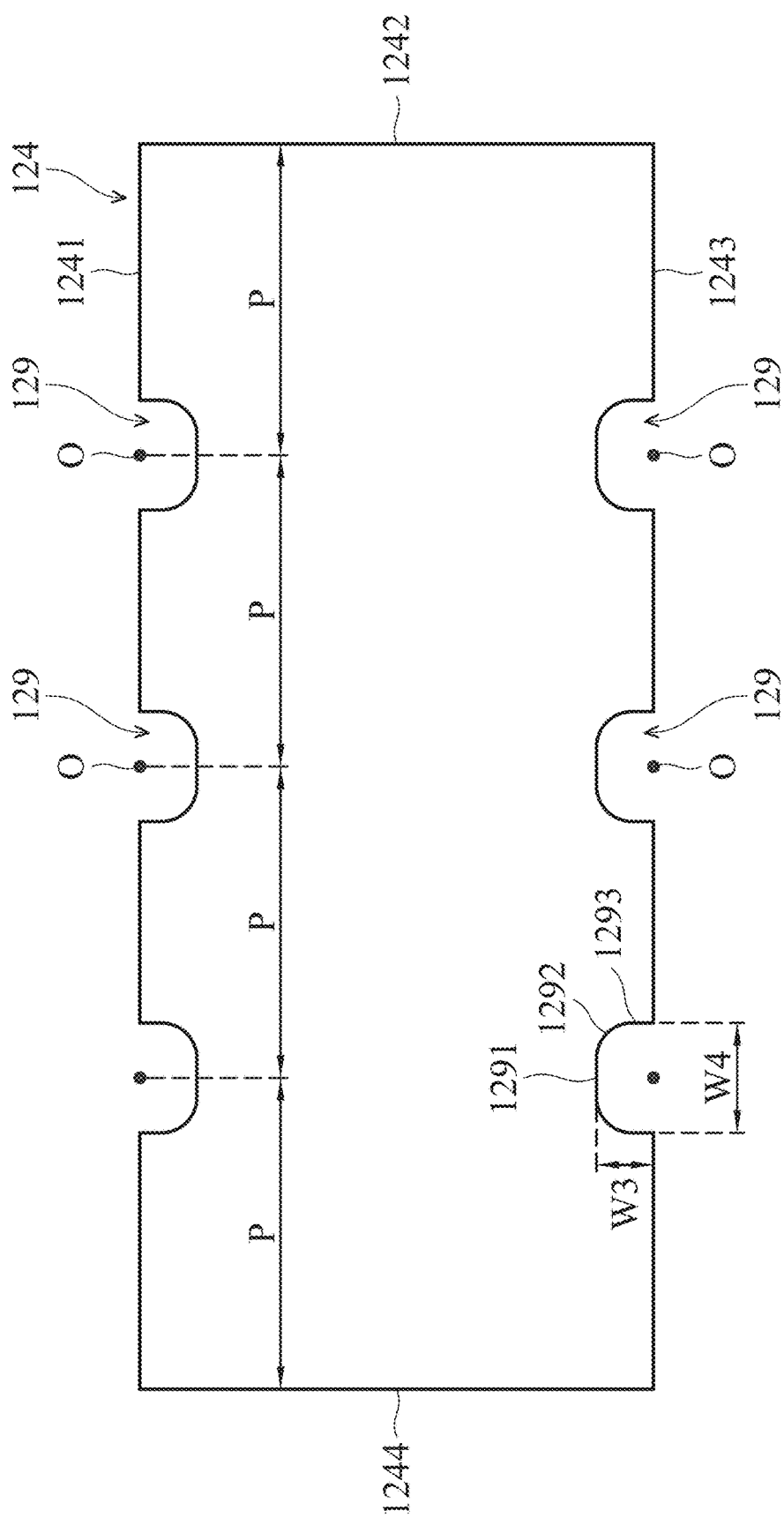
FIG. 5 shows a top view of an intermediate plate of an arc chamber, in accordance with some embodiments.

FIG. 5 shows a top view of the intermediate plate 124, in accordance with some embodiments. In some embodiments, the intermediate plate 124 has a rectangular shape including four sides, such as two opposite long sides 1241 and 1243, and two opposite short sides 1242 and 1244. Each of the long sides 1241 and 1243 are divided equally into four segments by three reference points O. Six gas outlets 129 are formed at the two long sides 1241 and 1243 of the intermediate plate 124 and arranged to correspond to the reference points O.

Therefore, the gas outlets 129 are arranged in first and second groups respectively lying along two opposite long sides 1241 and 1243 of the intermediate plate 124, and the first and second group each consists of three gas outlets spaced apart by the same pitch. In addition, the first and the third gas outlets in each of the first and second groups are respectively spaced apart from two opposite short sides 1242 and 1244 of the intermediate plate 124 by the same pitch P. The gas outlets 129 are generally symmetrically spaced about the center of the intermediate plate 124.

In some embodiments, as shown in FIG. 5, each gas outlet 129 has an inner edge 1291, two round edges 1292, and two side edges 1293. The inner edge 1291 is parallel to the corresponding long sides 1241 and 1243. The two side edges 1293 are vertically connected to the corresponding long sides 1241 and 1243. The two round edges 1292 respectively connect two ends of the inner edge 1291 to the two side edges 1293.

In some embodiments, the width W3 (width measured in a direction that is parallel to the short sides 1242 and 1244) of each gas outlet 129 is greater than the difference between the width W1 and W2, so that when the intermediate plate 124 is positioned in the first recess (FIG. 3), a portion of each gas outlet 129 is not covered by the bottom surface 1251 of the first recess 125. On the other hand, the width W4 (width measured in a direction that is parallel to the long sides 1241 and 1243) ranges from about 3.5 mm to about 6.0 mm.

Referring again to FIG. 3, the inlet port 13 is configured to connect the gas source 11 (FIG. 2) to the arc chamber 12. In some embodiments, the inlet port 13 is connected to the through hole 127 of the arc chamber 12. The inlet port 13 may have a first flow path 131 extending along the longitudinal direction of the inlet port 13 and a second flow path 132 vertically connected to the first flow path 131. The gas from the gas source 11 (FIG. 2) is supplied into the second recess 126 via the inlet port 13 in the order of the second flow path 132 and the first flow path 131.

Figure 6:
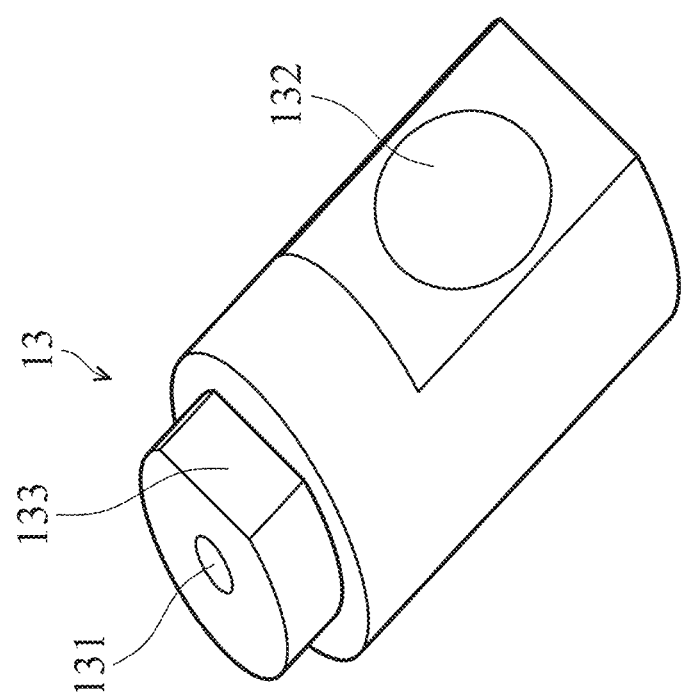
FIG. 6 shows a schematic view of an inlet port, in accordance with some embodiments.

FIG. 6 shows a schematic view of the inlet port 13, in accordance with some embodiments of the disclosure. In some embodiments, the inlet port 13 includes a head portion 133 formed at one end of the inlet port 13. The inlet port 13 connects the through hole 127 (FIG. 3) via the head portion 133. The head portion 133 has a shape that is compatible with that of the through hole 127.

Figure 7:
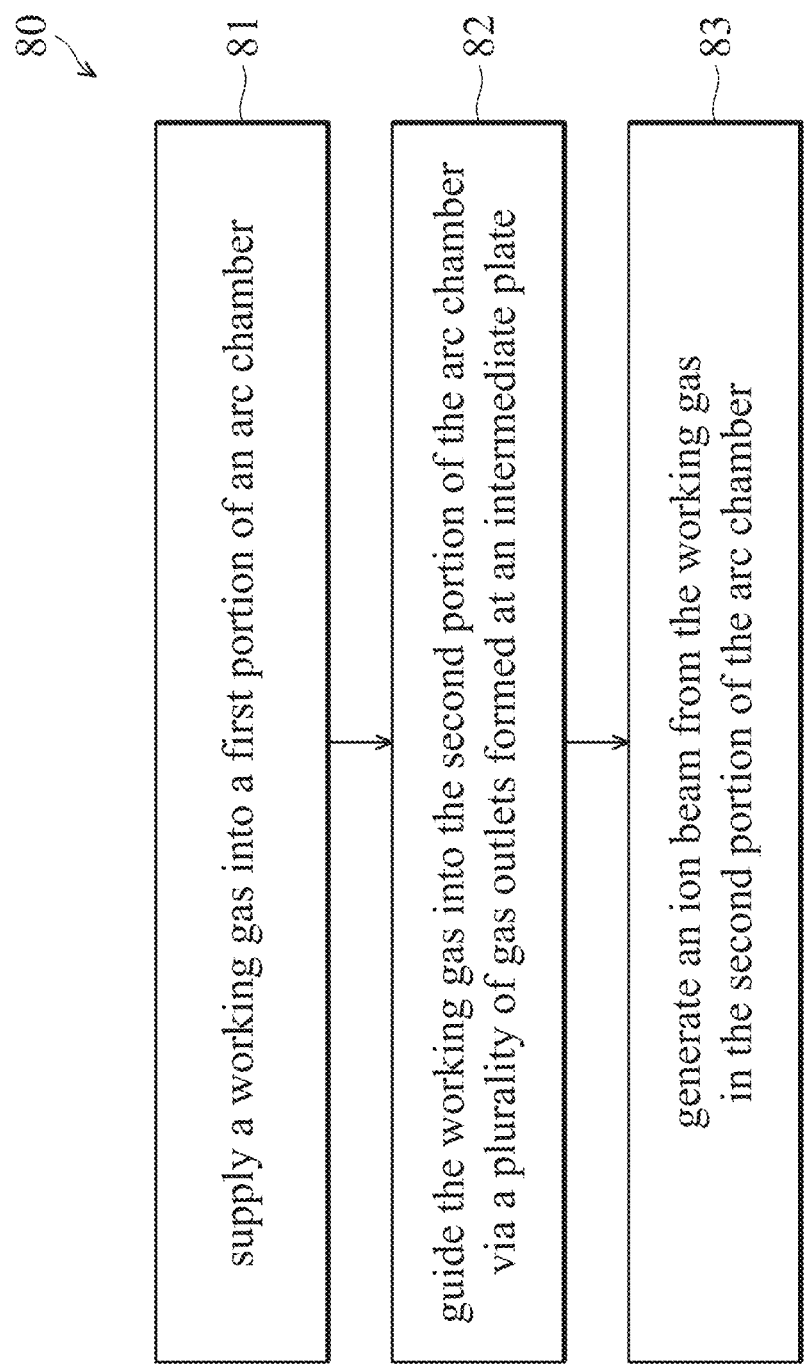
FIG. 7 shows a flow chart illustrating a method for generating an ion beam in an ion implantation process, in accordance with some embodiments.

FIG. 7 is a flow chart illustrating a method 80 for generating an ion beam in an ion implantation process, in accordance with some embodiments. For illustration, the flow chart will be described in company with the schematic views shown in FIGS. 2-6 and 8. Some of the described stages can be replaced or eliminated in different embodiments. Additional features can be added to the semiconductor device structure. Some of the features described below can be replaced or eliminated in different embodiments.

Figure 8:
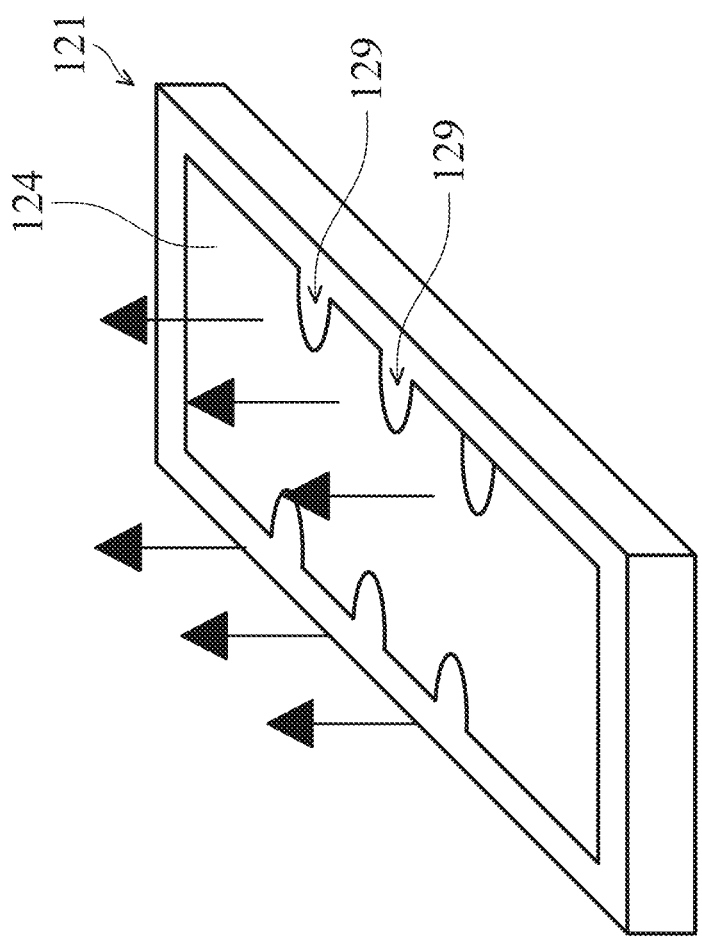
FIG. 8 shows a schematic view of a lower wall covered with an intermediate plate, schematically depicting flow patents of a gas.

The method 80 begins with an operation 81 in which a working gas is supplied into the first portion of the arc chamber 16. In some embodiments, the arc chamber 16 is divided into two portions by the intermediate plate 124. A first portion of the arc chamber 16 is underneath the intermediate plate 124 (i.e., space defined by the intermediate plate 124 and the second recess 126), and a second portion of the arc chamber 16 is above the intermediate plate 124 (i.e., space defined by the lower wall, side wall 1, and the top wall). The first portion and the second portion of the arc chamber 16 communicate with each other via the gas outlets 129 formed at the intermediate plate 124. The working gas may be applied to the arc chamber at a pressure from about 1.0 Torr to about 4.0 Torr Afterwards, the method 80 continues an operation 82 in which the working gas is guided into the second portion of the arc chamber 16 via the gas outlets 129 as shown in FIG. 8. In some embodiments, the working gas passes through the gas outlets 129 at the same flow rate, and thus the same amount of working gas is supplied to the regions above each of the gas outlets 129. Since the gas outlets 129 are spaced the same distance away from one another, the working gas becomes evenly distributed in the second portion of the arc chamber 16.

Figure 9:
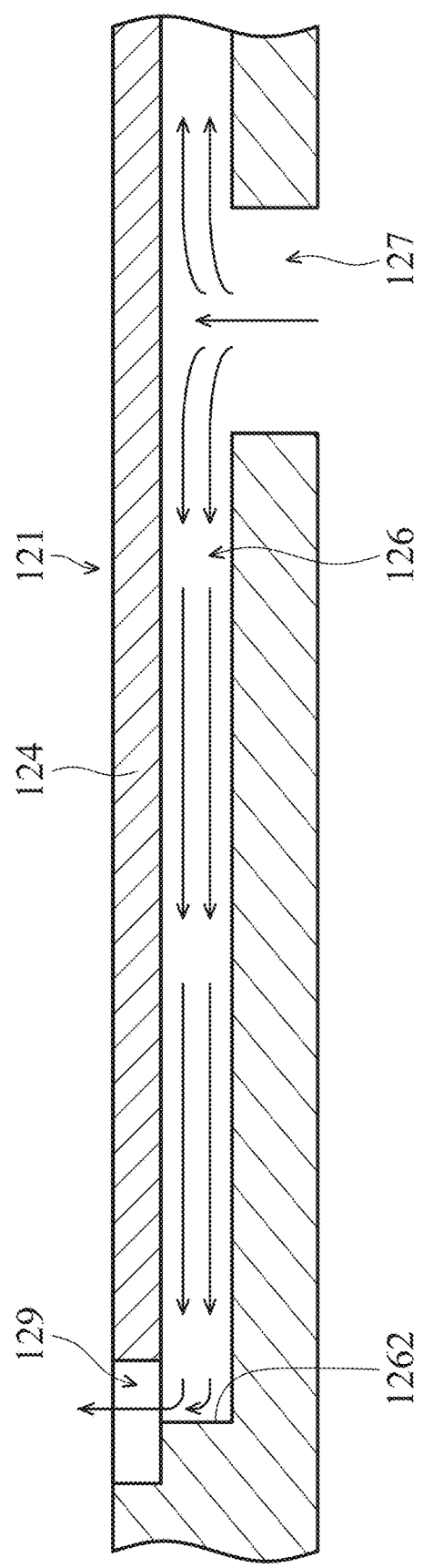
FIG. 9 shows a schematic cross-sectional view of a lower wall covered with an intermediate plate with gas discharging through gas outlets, schematically depicting flow patents of a gas.

It should be noted that, as shown in FIG. 9, since each of the gas outlets 129 is arranged to correspond to a side surface 1262 of the second recess 126, before the working gas enters the gas outlets 129, the working gas flows along the side surface 1262. As a result, the working gas is guided along a direction that is perpendicular to the immediate plate 126 by the side wall 1262 of the second recess 126. In this manner, the uniformity of the working gas in a depth direction of the arc chamber 16 is increased.

Afterwards, the method 80 continues an operation 83 in which an ion beam is generated from the working gas in the second portion of the arc chamber. In some embodiments, a radio frequency (RF) or microwave power is supplied to the filament 14 from the filament power supply 15 to excite free electrons within the second portion of the arc chamber 16. The arc current applied to the filament may be ranged from about 170 A to about 150 A. The excited electrons collide with the gas molecules to generate ions. The generated ions which are positively charged are extracted through the aperture 1231 by supplying a negative potential to the extraction electrode 19.

Figure 10A:
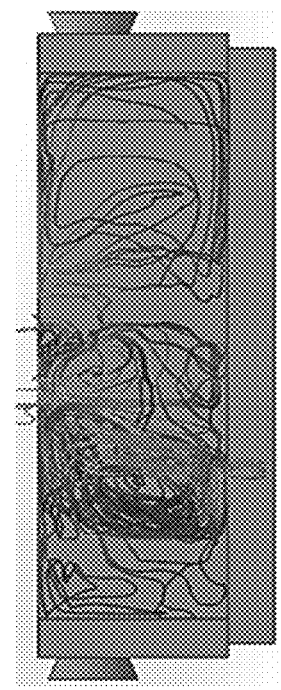
FIG. 10A shows a side view of a typical ion beam generator with single gas outlet, schematically depicting flow patents of a gas.
Figure 10B:
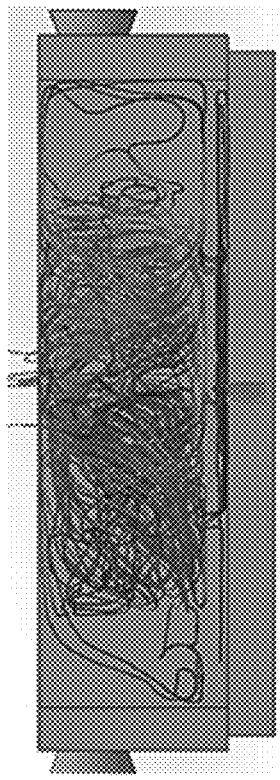
FIG. 10B shows a side view of an ion beam generator of the disclosure, schematically depicting flow patents of a gas.

FIG. 10A shows a side view of a typical ion beam generator with single gas outlet, depicting the flow field of a gas. FIG. 10B shows a side view of an ion beam generator 10 of the disclosure, depicting the flow field of a gas.

Compared with the typical ion beam generator, the gas is distributed more uniformly throughout the entire region of in the arc chamber 16 of the disclosure, especially the central region (i.e, the region between the filament 14 and the electrode 16 shown in FIG. 2) where the ionization process occurs.

Table 1 provides data from two tests that were conducted using an arc chamber with a single gas outlet and an arc chamber with multiple gas outlets. To generate an ion beam current using the arc chamber with a single gas outlet, the gas is supplied at a pressure of 2.0 Torr, and an electric current applied to the filament 14 is 2.8 A. To generate an ion beam current using the arc chamber with multiple gas outlets, the gas is supplied at a pressure of 1.3 Torr, and an electric current applied to the filament 14 is 1.9 A.

TABLE 1

|  | Tune beam parameter |  | Beam current (uA) | S/H life time (days) |
|---|---|---|---|---|
| bottom plate with single opening | Gas (Torr) Arc current (A) Source magnet (A) | 2.0 2.8 30.0 | 450 | 1.2 |
| bottom plate with multiple openings | Gas (Torr) Arc current (A) Source magnet (A) | 1.3 1.9 15 | 450 | 1.6 |

Embodiments of a method and apparatus for generating an ion beam for an ion implantation process are provided. Since gas to be ionized is supplied through multiple gas outlets into an ionized region in the arc chamber, the gas is uniformly distributed in the arc chamber. Compared to a typical arc chamber with a single gas outlet, the ion beam generator uses small amount of gas (35% gas usage reduction) and less electrical current (32% arc current reduction) to generate the same current of ion beam. As a result, the manufacturing cost is reduced. Additionally, since a lower electrical current is applied to the filament, the lifetime of the filament is increased (32% source head life time improvement). A higher throughput capability is realized since the expected and/or actual repair/replacement times are prolonged.

In accordance with some embodiments an ion beam generator used in a semiconductor processing system is provided. The ion beam generator includes an arc chamber. The arc chamber includes a lower all, a side wall, and an intermediate plate. The side wall is connected the lower wall. A first recess is formed on the lower wall, and a second recess is formed at a bottom surface of the first recess, and a through hole is formed at a bottom surface of the second recess. The intermediate plate is positioned in the first recess and includes a plurality of gas outlets formed on two opposite edges of the intermediate plate. The ion beam generator further includes a gas supply. The gas supply is connected to the through hole to supply gas into a gas reservoir defined by the intermediate plate and the second recess. The ion beam generator also includes a filament and an electrode. The filament and an electrode are respectively positioned in two sides of the side wall for generating an ion plasma.

In accordance with some embodiments an ion beam generator used in a semiconductor processing system is provided. The ion beam generator includes an arc chamber. The arc chamber includes a lower all, a side wall, and an intermediate plate. The side wall is connected the lower wall. The intermediate plate is positioned on the lower wall and includes six gas outlets. Each of two opposite long sides of the intermediate plate is equally divided into four segments by three reference points, the six outlets are arranged corresponding to the six reference points.

In accordance with some embodiments an ion beam generator used in a method for generating ion beam in ion implantation process is provided. The method includes sending supplying a working gas into a first portion of an arc chamber which is separated from a second portion of the arc chamber by an intermediate plate. The method further includes guiding the working gas into the second portion of the arc chamber via a plurality of gas outlets opposite edges of the intermediate plate. The method also includes generating an ion beam from the working gas in the second portion of the arc chamber.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An ion beam generator used in a semiconductor processing system, comprising:
   an arc chamber, comprising:
      a lower wall, wherein a first recess is formed on the lower wall, and a second recess is formed at a bottom surface of the first recess, and a through hole is formed at a bottom surface of the second recess;
      a side wall connected the lower wall; and
      an intermediate plate positioned in the first recess and comprising a plurality of gas outlets formed on two opposite edges of the intermediate plate;
   a gas supply connected to the through hole to supply gas into a gas reservoir defined by the intermediate plate and the second recess; and
   a filament and an electrode respectively positioned in two sides of the side wall for generating an ion plasma.

2. The ion beam generator as claimed in claim 1, wherein the gas outlets are arranged in first and second groups respectively lying along two opposite long sides of the intermediate plate, and each of the first and second group consists of three gas outlets spaced apart by a predetermined pitch.

3. The ion beam generator as claimed in claim 2, wherein the first and the third gas outlets in each of the first and second groups are respectively spaced apart from two opposite short sides of the intermediate plate by the same predetermined pitch.

4. The ion beam generator as claimed in claim 1, wherein the gas outlets are generally symmetrically spaced about the center of the intermediate plate.

5. The ion beam generator as claimed in claim 1, wherein a portion of each gas outlet is covered by the bottom surface of the first recess.

6. The ion beam generator as claimed in claim 1, wherein each of the gas outlets is arranged to correspond to a side surface of the second recess that connects the bottom surface of the first recess to the bottom surface of the second recess.

7. The ion beam generator as claimed in claim 1, wherein each of the gas outlets possesses a width ranging from about 3.5 mm to about 6.0 mm.

8. An ion beam generator used in a semiconductor processing system, comprising:
   an arc chamber comprising:
      a lower wall;
      a side wall connected to the lower wall;
      an intermediate plate positioned on the lower wall and comprising six gas outlets, wherein each of two opposite long sides of the intermediate plate is divided equally into four segments by three reference points, the six outlets are arranged to correspond to the six reference points;
   a gas supply connected to the arc chamber to supply gas into a gas reservoir immediately underneath the intermediate plate; and
   a filament and an electrode respectively positioned in two sides of the side wall for generating an ion plasma.

9. The ion beam generator as claimed in claim 8, wherein a first recess is formed in a top surface of the lower wall, a second recess is formed at a bottom surface of the first recess, and a through hole is formed at a bottom surface of the second recess;
   wherein the intermediate plate is positioned in the first recess, and the gas supply is connected to the through hole.

10. The ion beam generator as claimed in claim 9, wherein a portion of each gas outlet is covered by the bottom surface of the first recess.

11. The ion beam generator as claimed in claim 9, wherein each of the gas outlets is arranged to correspond to a side surface of the second recess that connects the bottom surface of the first recess to the bottom surface of the second recess.

12. The ion beam generator as claimed in claim 8, wherein a top surface of the intermediate plate and a top surface of the lower wall are the same height.

13. The ion beam generator as claimed in claim 8, wherein the gas outlets are generally symmetrically spaced about the center of the intermediate plate.

14. The ion beam generator as claimed in claim 8, wherein each of the gas outlets possesses a width ranging from about 3.5 mm to about 6.0 mm.

15. A method, comprising:
   supplying a working gas into a first portion of an arc chamber which is separated from a second portion of the arc chamber by an intermediate plate;
   guiding the working gas into the second portion of the arc chamber via a plurality of gas outlets formed at two opposite edges of the intermediate plate; and
   generating an ion beam from the working gas in the second portion of the arc chamber.

16. The method as claimed in claim 15, wherein the arc current applied to the filament ranges from about 150 A to about 170 A.

17. The method as claimed in claim 15, wherein the working gas is supplied to the arc chamber at a pressure from about 1.0 Torr to about 4.0 Torr.

18. The method as claimed in claim 15, wherein the working gas passes through each of the gas outlets at the same flow rate.

19. The method as claimed in claim 15, wherein guiding the working gas into the second portion of the arc chamber via the plurality of gas outlets comprises guiding the working gas along a direction that is perpendicular to the immediate plate by a side wall of the first portion of the arc chamber.

20. The method as claimed in claim 15, wherein the working gas comprises boron trifluoride, phosphine, and arsine.

* * * * *